United States Patent [19]

Hua et al.

[11] Patent Number: 5,422,317
[45] Date of Patent: Jun. 6, 1995

[54] PERFORMANCE ENHANCED INTERGRATED CIRCUIT LAYOUT METHODOLOGY

[75] Inventors: Hung K. Hua; Arthur B. Oliver, both of Austin, Tex.

[73] Assignee: Advanced Micro Devices, Inc., Sunnyvale, Calif.

[21] Appl. No.: 237,325

[22] Filed: May 3, 1994

Related U.S. Application Data

[63] Continuation of Ser. No. 12,989, Jan. 28, 1993, abandoned.

[51] Int. Cl.$^6$ ............................................. H01L 21/00
[52] U.S. Cl. ................................... 437/250; 437/51; 364/488; 364/491
[58] Field of Search ................................... 437/250, 51

[56] References Cited

U.S. PATENT DOCUMENTS

| | | | |
|---|---|---|---|
| 4,817,012 | 3/1989 | Cali | 364/488 |
| 4,827,428 | 5/1989 | Dunlap et al. | 364/488 |
| 5,081,602 | 1/1992 | Glover | 364/488 |
| 5,095,454 | 3/1992 | Huang | 364/488 |
| 5,119,314 | 6/1992 | Hotta et al. | 364/488 |

Primary Examiner—Olik Chaudhuri
Assistant Examiner—H. Jey Tsai
Attorney, Agent, or Firm—Conley, Rose & Tayon

[57] ABSTRACT

A performance enhanced simulation modeling technique is provided for optimizing integrated circuit layout. The modeling technique utilizes a performance enhanced methodology. Namely, a physical design enhances performance design to ensure that the simulation model takes into account placement and interconnect when determining whether or not the resulting integrated circuit will operate properly at required speed with actual load being applied. An initial sizing of selected devices within a network is performed using estimated time duration and load factors. Subsequently, select devices are resized according to more optimal physical time duration and load. The entire simulation modeling is achieved using computer program simulation prior to the generation of a final layout placeable upon a silicon substrate. As such, simulation methodology provides a flow to correct unexpected performance errors resulting from physical design.

13 Claims, 3 Drawing Sheets

PERFORMANCE ENHANCED INTERGRATED CIRCUIT LAYOUT METHODOLOGY

This is a continuation of application Ser. No. 08/012,989 filed Jan. 28, 1993, now abandoned.

BACKGROUND OF THE INVENTION

Incorporated herein is a computer program listing microfiche appendix of source code used to model an integrated circuit according to the present invention. Copyright, 1993, Advanced Micro Devices, Inc. A portion of the disclosure to this patent document contains material which is subject to copyright protection. The copyright owner has no objection to the facsimile reproduction by anyone of the "microfiche appendix", as it appears in the Patent and Trademark Office file or records, but otherwise reserves all copyright rights whatsoever.

1. Field of the Invention

This invention relates to an enhanced integrated circuit simulation layout methodology and more particularly to a layout driven performance design methodology which determines optimal sizing of various electronic devices to be placed upon an integrated circuit.

2. Background of the Relevant Art

The process of manufacturing an integrated circuit begins with a logic/circuit sketch of various devices coupled together in a network necessary to accomplish the desired circuit outcome. Each network includes a series of electronic devices having the output node of one device connected to the input node of one or more subsequent devices. Each device is thereby sized to provide adequate drive needed for activating the subsequent connected devices. Sizing of select devices may entail increasing or decreasing circuit gate configuration to meet the desired fan-out load of the subsequent devices.

Devices connected in a network must operate under certain timing and load constraints. Knowledge of load and timing are important in the design of high performance VLSI circuit. While an electronic device may operate perfectly well as a stand-alone device or under certain load constraints, the same device may not operate when coupled to various other devices within a network. For example, when a device is coupled to a known load, the device can be configured to generally propagate a signal from its input node to its output node within an acceptable time period or duration. However, when the same device is coupled to a series of devices within a network, it may not operate at its 10 targeted time duration or speed due to the additional loading seen at its output node. This problem becomes magnified whenever the interconnect between devices is quite large or small. Interconnect or routing carries with it an associated impedance load. Long and thin interconnect lines present a larger impedance than if the lines are short and wide. Moreover, as interconnect length is increased, resistive-capacitive constant also increases thereby slowing the response time of any signal sent through the interconnect. As such, longer interconnect may increase the associated signal time duration causing certain networks to become inoperable under limited time constraints. High speed VLSI process technologies often enjoy smaller device layout, however, they generally have relatively more extensive interconnect placed between devices. The interconnect length may vary drastically depending upon the specific location in which each device is placed within the chip or integrated circuit area.

In an effort to model performance of various networks under load, traditional layout methodologies utilize computer simulation techniques. Computer simulation entails placing an estimated load impedance at the output node of each device. Given the estimated load, a time propagation or duration between activation of input node and output node can be formulated. The estimated load and estimated time duration for each device is thereby presented to the computer as input in order to determine whether or not the various networks or paths can timely produce a desired output (i.e., whether or not they can operate at speed). Various networks which barely exceed the time constraints necessary to produce an output are denoted as "critical networks." Once critical paths have been identified, the designer often tunes or sizes the circuits of selected devices within the paths to ensure all networks, and especially the critical networks, meet the speed performance goal.

The sizing process may involve changing the gate widths or lengths of circuits within each device so that the respective device produces greater or less drive to the estimated load. After specified devices are sized, the resulting network is then physically placed via photolithography onto a wafer. Unfortunately, sizing changes are generally performed without knowledge of where the devices are to be physically located upon or within the integrated circuit area. As such, the designer will not have knowledge of the amount of interconnect coupled between devices. For example, a device at the chip's upper left hand corner which is to connect to a device at the lower right hand corner must have increased drive capability necessary to offset the added load impedance associated with the lengthy interconnect. In VLSI designs, cross-chip interconnect can be several thousand microns or more, thereby adding to the potential variability of the interconnect length. Unless the chip designer can somehow predict or dictate approximately where each device will be physically located upon the chip, he or she cannot accurately determine whether or not each critical network can meet the speed requirements necessary for circuit operation.

Traditional layout methodologies generally involve computer simulation without knowledge of physical layout parameters and/or device locations. After simulation under estimated load and time duration is accomplished, selected devices are sized and a final layout is then sent to the mask shop for processing upon silicon. The designer generally does not know whether the critical networks of the final layout will operate at speed until the first silicon samples are tested. If first silicon does not operate properly, the designer must resize specific circuits and form another final layout for the production of second silicon. Not only is silicon revisions costly, but it is also time consuming. In today's marketplace it is imperative that manufacturers quickly present an operable work product to customers. Thus, marketplace dictates that first silicon be operable at the performance goals set by the designer. Subsequent revisions, which may take several weeks, must be avoided.

SUMMARY OF THE INVENTION

The problems outlined above are in large part solved by the integrated circuit layout methodology of the present invention. That is, the methodology hereof utilizes simulated placement and routing of interconnect upon a modeled integrated circuit area prior to resizing of selected devices. Placement prior to resizing allows the designer to ascertain a physical load impedance and physical time duration much closer to the actual load and time duration then conventional estimated load and time duration. Thus, "physical load" and "physical time duration" denotes respective load and time duration substantially equal to actual load and time duration for each device placed upon the operating network.

The present invention performs initial benchmark sizing using estimated load and estimated time duration as in conventional computer simulated sizing methodology. However, the present invention further models each device and network within an integrated circuit area and then simulates actual routing between devices in order to obtain physical load and physical time duration. Physical load and physical time duration can be then used for subsequent computer simulation in order to more accurately determine subsequent sizing, or "resizing," necessary for optimal circuit performance. Knowing physical loads and time durations thereby allows the designer to resize certain select devices in order to take into account the variability of interconnect placed between devices. As such, the present invention achieves true performance enhanced layout design modeling of an integrated circuit which functions at or substantially near actual timing and load constraints before silicon is fabricated. The estimated time duration and estimated load associated with conventional methodologies do not provide adequate information to the designer and, accordingly, is enhanced by using actual physical time duration and physical load as simulation inputs to achieve a more optimal model according to the present invention. The methodology hereof provides a flow to correct unexpected performance errors resulting from physical design. In conventional methods, without the capability to correct for such errors, designers may try to minimize such problems by making costly assumption during performance and physical designs such as presenting a more conservative interconnect load model or a more restricted timing constraint. The assumptions may prove incorrect resulting in wasted silicon and design time.

Broadly speaking, the present invention contemplates an integrated circuit layout methodology. The present methodology comprises providing a plurality of electronic devices, wherein each device has an input node, an output node and an estimated time duration between activation of the input and respective output node. The electronic devices operation is modeled on a computer simulated program capable of simulating an input signal upon the input node of each modeled device. Select devices are then sized in accordance with a first computer simulated output signal responsive to the input signal in order to achieve an optimal time duration and voltage magnitude. An important aspect of the present invention is the subsequent step of modeling the placement and routing of each device at specific locations within a simulated integrated circuit area. The computer simulated input signal is then reapplied at the input node of each device to effect resizing of select devices and to achieve a second computer simulated output signal from each output node of optimal time duration and voltage magnitude. Because the computer simulated input signal is reapplied after the modeled place and route step, the second computer simulated output signal depicts a truer reading then the first computer simulated output of an integrated circuit performing according to final layout parameters. Being more accurate, the second computer simulated output signal provides a more accurate depiction of circuit operation necessary for precision resizing of select devices.

The present invention further contemplates choosing each specific electronic device used in each network from a library of layout cells. Each device layout cell having an associated estimated load impedance and estimated time duration.

The present invention still further contemplates adjusting the specific location in which select electronic devices are placed. The resizing step and adjusting step may be repeated to obtain a final layout configuration. A mask embodying the final layout configuration may be generated, whereby the final layout may be processed upon a silicon substrate to produce an integrated circuit.

BRIEF DESCRIPTION OF THE DRAWINGS

Other objects and advantage of the invention will become apparent upon reading the following detailed description and upon reference to accompanying drawings in which.

Figure 1:
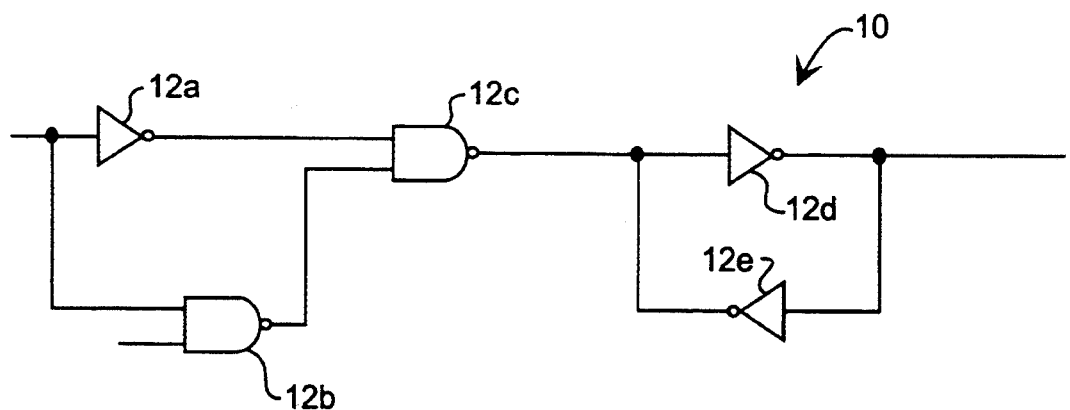
FIG. 1 is a logic diagram of an exemplary network of electronic devices capable of being modeled according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a network 10 containing a plurality of electronic devices 12. As defined herein, device 12 includes any circuit which provides a specific output signal in response to a specific input signal. Exemplary such devices include, but are not limited to, inverters, and gates, nor gates, registers, counters, multiplexers, encoders, buffers, flip flops, transmission gates (or pass gates), diodes, etc. Each device 12 is shown having at least one input node, and at least one output node and a specific propagation delay or time duration between activation of an input node and subsequent activation of an output node. Network 10 is but one example of many different types of networks which may be used in an integrated circuit. Therefore, network 10 is illustrated for exemplary purposes only and is not limiting of the various types of device combinations or networks which can be simulated and sized by the present invention.

Network 10 may require operation within a certain timing constraint, whereby each device 12 must have a time duration not exceeding a specific value. For example, the total time allocated for operation of network 10 may be ten nanoseconds. As such, devices 12a and 12b may be constrained to operate in less than three nanoseconds, device 12c to operate in less than four nanoseconds and devices 12d and 12e to operate in less than three nanoseconds in order that the total network time constraint is less than ten nanoseconds. Devices 12a and 12b must propagate the input signal at approximate the same time duration to present a substantially simultaneous input signal upon device 12c.

Figure 2:
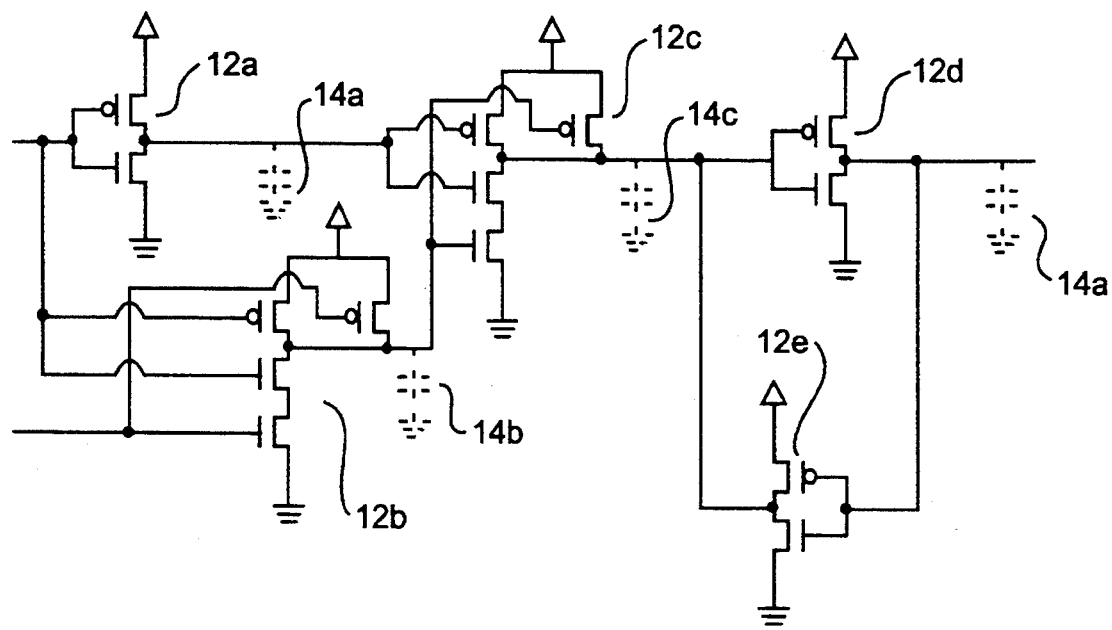
FIG. 2 is a circuit diagram of the logic diagram of FIG. 1 with associated loads according to the present invention.

Timing constraints are target constraints by which network 10 must operate in order to achieve required speed and optimal performance of the integrated circuit embodying network 10. Computer simulation methodology of prior designs begin by choosing a specific cell layout for each device 12 and assigning that cell layout to having an estimated time duration and estimated output load. These estimated values are necessary in performing computer simulation needed for subsequent sizing of each device. As shown in FIG. 2, each device 12 can be represented at a transistor level. A suitable transistor technology includes field effect transistors (FET) such as MOS or bipolar; however, other technologies are equally suitable for simulation by the present invention. As illustrated in FIG. 2, actual loads 14 (impedance and/or capacitance) caused by physical layout is present at the output node of each device. Load 14 may or may not be equal to the estimated load used by conventional circuit simulation models. In fact, actual load 14 is usually greater than or less than the estimated load values, depending upon (i) the length of interconnect placed between devices 12 and (ii) the input load impedance and capacitance of subsequent connected devices 12. Thus, actual load 14 becomes a factor of the specific location in which each device 12 is placed upon a silicon surface area and is also a factor of the cell layout chosen from the cell library representative of each device 12. For example, if nand gate 12c has associated with it a fairly large input impedance and capacitance, and if the interconnect between inverter 12a and nand gate 12c is fairly long, then inverter 12a may need to be sized to provide additional drive needed to activate nand gate 12c at substantially the same time in which nand gate 12b activates nand gate 12c. Otherwise, network 10 may be inoperable at the targeted operation speed.

FIGS. 1 and 2 illustrates the importance in attempting to model the load and time duration of each device 12 as accurately as possible. However, until the designer places and routes each device 12 upon the chip area, close modeling of load and time duration is difficult at best. Any change of one or more device parameters may effect all devices 12 within the network 10. Therefore, it becomes imperative that final or near final modeled layout be achieved knowing approximately where each device 12 will be located upon the integrated circuit area, and so that sizing of select devices 12 is achieved with relatively few interations.

Figure 3:
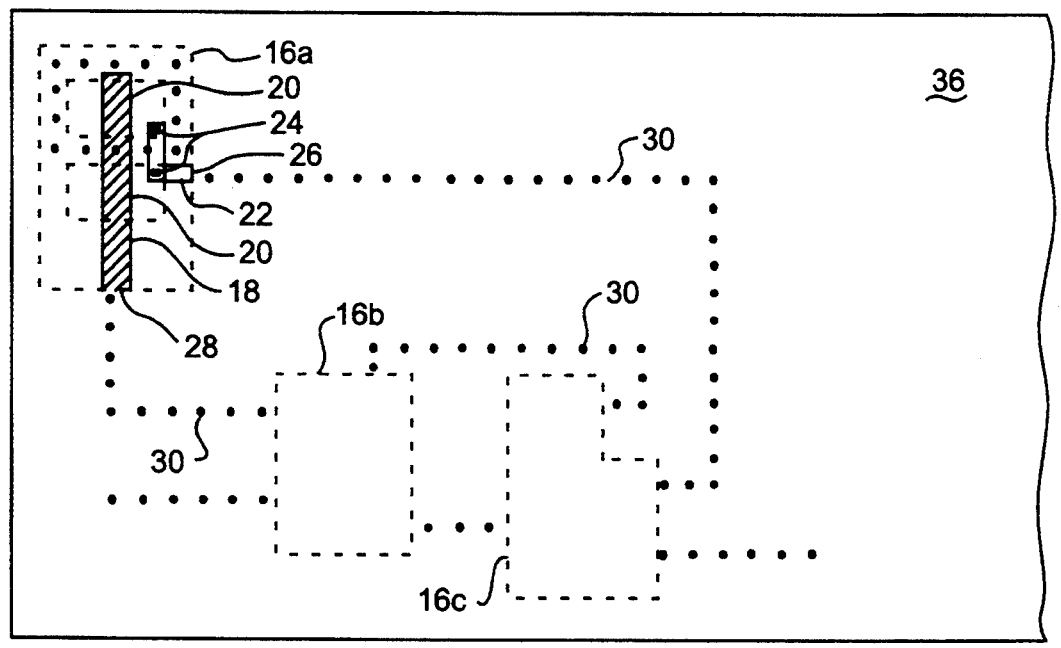
FIG. 3 is a partial topographical diagram of the circuit in FIGS. 1 and 2 placed upon an integrated circuit area according to the present invention.

Turning now to FIG. 3, a partial topographical diagram of various layout cell structures 16 representing devices 12 are connected together as network 10 configured within an integrated circuit area 36. As defined herein, "integrated circuit area" refers to a computer simulated area modeled to represent the actual final layout area. Integrated circuit area does not imply actual final physical layout area or that the devices are actually placed upon an area of actual silicon substrate. The present methodology is for simulation modeling before the devices are actually placed upon silicon. First device 12a is shown in simulated layout form as cell 16a. Cell 16a illustrates simulated areas of diffusion, etch, deposition, etc. of various structures such as polysilicon, metal, silicon dioxide, nitride, etc. generally well known in the art and necessary for fabrication of an integrated circuit. Specifically, cell 16a is partially representative of the topographical layout of inverter 12a having polysilicon gate 18 placed over gate oxide 20 of, e.g., p-channel and n-channel transistors as well known in the MOS art. The output node may be coupled together as metal 22 via contact regions 24 as shown. It is understood, however, that other forms of contact or routing may be used, and that all forms of layout suitable to provide the necessary device outcome falls within the scope and spirit of the present invention. Output node 26 is shown connected to cell 16c which, in the example given in FIGS. 1 and 2, is the input of a two input nand gate. Moreover, input node 28 of cell 16a is shown coupled to cell 16b (exemplary device being a two input nand gate 12b). In prior designs, routing 30 placed between cells 16 is not formed until after simulation is complete. Thus, prior art modeling designs will not provide the designer with knowledge of the extent of routing 30 nor the approximate gate sizes of subsequent connected cells such as 16c, 16d and 16e. However, as will be explained below, the present modeling design performs simulation both before and after routing 30 is modeled and both before and after approximate gate sizes of cells 16 are chosen and initially sized.

Figure 4:
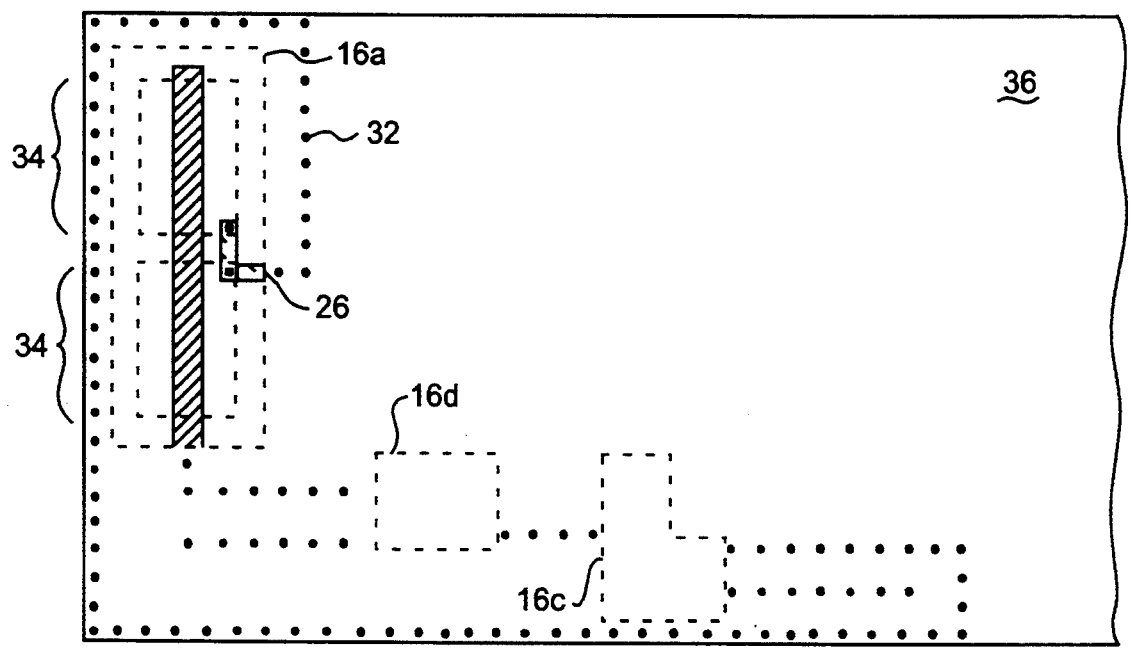
FIG. 4 is a partial topographical diagram of the circuit in FIGS. 1 and 2 having a resized device placed upon an integrated circuit area according to the present invention.

FIG. 4 illustrates what might arise after placement of device cells 16 and routing of interconnect at approximate locations upon an integrated circuit area 36. A rather lengthy and contorted interconnect routing 32 may be necessary as a result of placement and routing constraints. Routing 32 which connects output node 26 of first device cell 16a to a second device cell 16c may require rerouting to avoid congested areas and may also have associated with it various jumpers from, e.g., polysilicon to metal, polysilicon to nitride, metal to polysilicon, first metal to second metal, first polysilicon to second polysilicon, etc. Further, cell 16c shown in FIG. 4, may require reconfiguration to be smaller than the initial chosen cell (possible due to the reconfigured cell not requiring as much pass through interconnect lines or due to the reconfigured cell having smaller gate sizes, etc.). Due to reconfigured cell 16c and elongated routing 32, cell 16a may require more drive. As such, gate width 34 of both the p-channel and n-channel transistors are shown larger than the gate widths illustrated in FIG. 3. It is understood that other methods of increasing drive (or decreasing drive) can be effectuated in order the achieve the desired result beyond merely increasing or decreasing the gate widths. For example, the gate lengths can be decreased or increased as well as external buffer circuitry added or subtracted to achieve the same result. Still further, interconnect routing 32 can be widened to offset the lengthened routing. Therefore, "sizing" and "resizing" as defined herein refers to any form of reconfiguration associated with any device or routing placed upon the integrated circuit area to achieve simulated optimal performance result.

Figure 5:
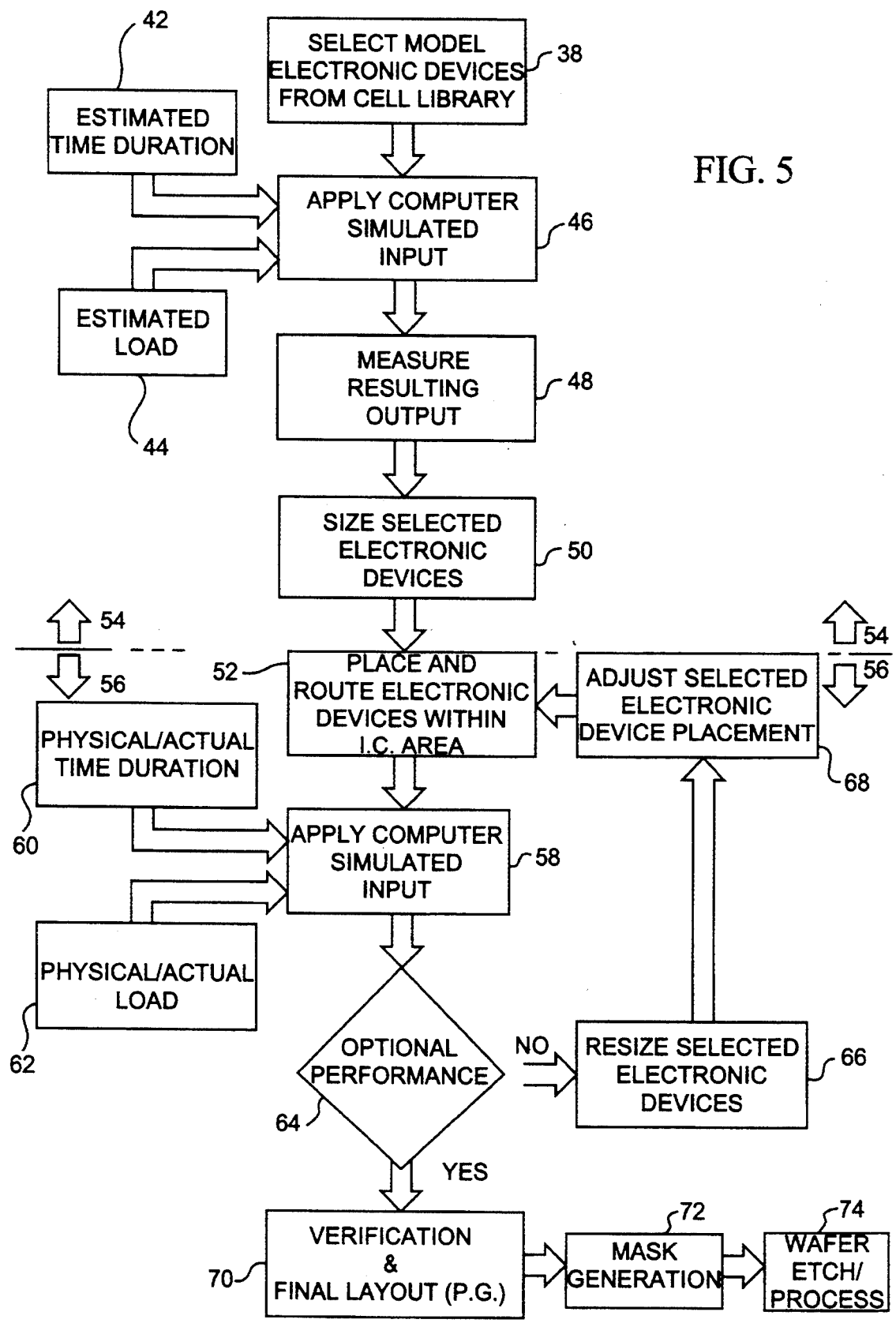
FIG. 5 is a flow diagram of the enhanced integrated circuit layout methodology according to the present invention.

Referring now to FIG. 5, a flow diagram is shown illustrating an enhanced integrated circuit layout methodology according to the present invention. The precision modeling technique described herein utilizes both a performance design technique and a physical design technique to allow a more comprehensive modeling at or near the actual, final circuit layout configuration. The present modeling technique begins with performance design steps 54 generally found in conventional modeling, but adds to the performance technique several physical design steps 56 using physical time duration and physical load after the devices and related interconnect are modeled upon an integrated circuit area to affect a more accurate resizing of select devices. Modeling takes place using a program which interfaces with a simulation program commonly known in the art, such as GARDS, manufactured by Silvar-Lisco, Inc. of Sunnyvale Calif. GARDS is mostly written in C language except a small portion of the automatic routing routine which is written in FORTRAN. GARDS program can be run on workstations manufactured by Apollo Corporation of Chelmsford, Mass. GARDS can also be run on workstations model no. 700 series manufactured by Hewlett Packard Corporation of Sunnyvale, Calif., or model no. RS6000 manufactured by I.B.M. Corporation of Armonk, N.Y. Automatic place and route programs, such as GARDS (gate array design system), provide an automatic cell-based layout tool. Interactive placement and automatic routing are achieved by the simulation programs which are then back annotated into physical design steps described herein. The physical design steps are thereby performed knowing approximate locations of each modeled device upon the integrated circuit area. Thus, resizings are performed not under estimated load and time durations but under more accurate load and time durations obtained from simulated place and route programs such as GARDS.

The first step shown in FIG. 5 is that of choosing one or more electronic devices 12 from a library of devices as shown in step 38. Generally, integrated circuit manufacturers have numerous cell libraries stored in computer memory which can be drawn upon and placed at selected location within a network 10. There may be several different cells representing, e.g., an inverter circuit depending upon the input and output locations as well as the mandated shape and size restrictions (i.e., possibly due to pass-through routing or absence thereof). The cell library is thereby called upon and specific cells having specific time delays and load factors denoted in the computer simulated program.

Each cell chosen from the library of cells has associated with it time delay characteristics such as intrinsic time delay as well as transition (external) delay. Intrinsic delay is delay associated with the specific cell function absent any external connection, whereas transition delay is a function of interconnect attached to the cell as well as the loads of subsequent connected devices. A timing path, consisting of a chain of one or more devices, has an associated time delay needed for a signal to propagate through the path. There are many ways to assign time allowances or time durations to each device within the path so that the sum of all devices' time durations is less than or equal to the delay limit of the path. Devices are normally sized according to their time duration. Each cell also has certain intrinsic and extrinsic load factors. The time duration and load factors, both intrinsic and extrinsic, can only be estimated at the performance stages 54 since the operator cannot be certain as to how many subsequent connected devices might be utilized in the network. The designer, whose network the computer models, does not generally know the magnitude of interconnect or the amount of resizing necessary for subsequent connected devices at the performance stages 54. Therefore, he or she must estimate the best they can those values and input them into the computer simulation model as shown by blocks 42 and 44.

Once the chosen cells are interconnected and the estimated values are input, a computer generated input signal is placed upon the modeled network 10 as shown by block 46. The input signal can be of any value and is preferably chosen at the magnitude and speed necessary for actual operation. Input signal can be varied to "stress" the critical networks in order to determine whether or not they can meet the speed requirements under severe conditions. If one or more critical networks, or any other network, does not operate properly, a first simulated output signal can be measured to indicate any such improper operation. Measurement of the first output signal is shown by step 48. If the resulting measurement indicates improper operation, one or more devices 12 within one or more networks 10 can be sized such that subsequent computer simulation will produce proper operation of each and every network. Thus, sizing step 50 may be an iterative process and is preferably convergent upon an optimal solution. However, in some circumstances, a change in one device may cause various changes in other devices thereby preventing a convergent solution. In such a case, the operator may find it necessary to adjust the variable parameters of the simulation model.

Once initial sizing is complete, performance design 54 is also complete. However, if final layout is performed under performance design 54 only, then the resulting integrated circuit may not operate at speed. Due to unforeseeable variations in interconnect routing and device resizing, the actual loads may not be substantially equal to the estimated load values. Thus, second and third silicon revisions may have to take place. In an effort to solve this problem, the present invention utilizes a physical design 56 subsequent to performance design 54.

Physical design begins by taking the select electronic devices, of which some devices were previously sized, and placing those devices at specific locations within an integrated circuit area 36. This step of placing and routing devices and interconnect, respectively, is shown by block 52. The computer performs the placement routine using a program which interfaces with automatic place and route programs described above. Specifically, the program receives input cell configuration and node locations for each device. An internal representation of each cell is then modeled at specific location areas stored in the computer memory. Each device model is adapted to receive computer input signals, or clocking signals, used to trace and identify timing points so that time delay between specific points, called timing paths, can be ascertained. Timing paths with performance problems can be corrected by a resizing step described below. By interfacing with automatic place and route programs, the present methodology can simulate placement and routing of interconnect between devices 12 having approximately the same size as what is encountered by the final layout. The program of simulating place and route is written partly in LISP language and partly in C language. The program is compiled and performed on Apollo, Inc. of Chelmsford, Mass. model no. DN3000 and DN4000, or on Hewlett Packard, Inc. of Sunnyvale Calif. model no. 400 series workstations.

Once specific locations and interconnect geometry are substantially fixed, the designer can ascertain a physical time duration and physical load which is substantially closer to the actual time duration and actual load than that of the estimated time duration and estimated load. Thus, having physical time duration and load as its input, the computer simulation during physical design 56 can reapply the computer simulated input as shown by block 58 with truer variables shown by blocks 60 and 62. A second simulated output signal is thereby produced and, based upon the timing and magnitude of that signal, computer simulation modeling determines whether or not optimal, required performance is achieved as shown by decision block 64. If the measured second simulated output signal does not show proper result, then select electronic devices are resized 66 and possibly the placement of devices are adjusted 68 upon the modeled circuit area.

Resizing and placement adjustment can be an iterative process and may require several operations in order to produce a convergent solution. Preferably, since physical design 56 follows an initial performance design benchmark, a solution is more likely to converge knowing that a modeled sizing configuration near that of the final layout size value has been previously determined. Once the solution converges, preferably after one or after only a few interations, the simulated layout solution is verified and a final layout is produced 70. According to techniques standard in the art, the final layout is digitized and sent through pattern generation (PG) to a mask production step 72. Thereafter, a wafer can be processed from the generated mask as shown by step 74. The wafer produced by the modeling technique of the present invention preferably operates without having to generate subsequent masks or fixes to the initial mask. Thus, the present methodology preferably produces first silicon which operates at the desired speed and at the resulting actual load.

It will be appreciated by the skilled in the art having benefit of this disclosure that this invention is believed to be capable of having applications with numerous types of devices 12 and networks 10, or with numerous dissimilar types of transistor technology. Furthermore, it is also to be understood that the form of the invention shown and described is to be taken as an exemplary preferred embodiment. Various modifications and changes may be made without departing from the spirit and scope of the invention as set forth in the claims. It is intended that the following claims be interpreted to embrace all such modifications and changes which provide substantially the same function as that described herein.

What is claimed is

1. An integrated circuit simulation methodology for manufacturing an integrated circuit, comprising the steps of:

providing a model of electronic devices, each device having an input node, an output node and a time duration between activation of said input node and said output node;

applying a computer simulated input signal upon each said input node;

sizing select said plurality of electronic devices to achieve a first computer simulated output signal from each said output node having a first time duration and voltage magnitude;

configuring a model of each said device at specific locations within an integrated circuit area, and connecting a model of routing between each said device;

reapplying said computer simulated input signal upon each said input node;

resizing select said electronic devices based on variability of said routing length in order to achieve a second computer simulated output signal from each said output node of a second time duration and voltage magnitude, wherein said second time duration and voltage magnitude is closer than said first time duration and voltage magnitude to an actual time duration and voltage magnitude of an actual output signal emitted during times in which actual said electronic devices are physically embodied within an integrated circuit semiconductor substrate; and obtaining a final layout configuration and processing said final layout configuration upon a silicon substrate to produce an integrated circuit.

2. The integrated circuit simulation methodology as recited in claim 1, wherein said configuring step comprises connecting the output node of a first electronic device to an input node of a second electronic device.

3. The integrated circuit simulation methodology as recited in claim 2, wherein the output node of said first device comprises a physical load impedance substantially equal to the impedance of an interconnect placed between said first and second device and the impedance at the input node of said second device.

4. The integrated circuit simulation methodology as recited in claim 3, wherein said configuring step comprises determining said physical load impedance as a function the specific location in which said first and second electronic devices are placed and routed within said integrated circuit area.

5. The integrated circuit simulation methodology as recited in claim 1, wherein said reapplying step comprises determining physical time duration between activation of the output node of said first device with respect to activation of the input node of said first device.

6. The integrated circuit simulation methodology as recited in claim 5, wherein said configuring step comprises determining said physical time duration as a function of where said first and second electronic devices are placed and routed within said integrated circuit area.

7. An integrated circuit simulation methodology for manufacturing an integrated circuit, comprising the steps of:

providing a model of electronic devices, each device including an input node and an output node;

providing a load impedance at each said output node and a time duration between activation of each said input node and respective said output node;

applying a computer simulated input signal upon each input node;

measuring a first simulated output signal upon each output node;

sizing select said plurality of electronic devices in response to measured said first simulated output signal to achieve a first performance state at said load impedance and time duration;

configuring a model of each said device at specific locations within an integrated circuit area and connecting a model of routing between each said device to obtain a physical load impedance and a physical time duration;

reapplying said computer simulated input signal upon each said input node;

measuring a second simulated output signal upon each output node; and resizing select said plurality of electronic devices based on variability of said routing length in order to achieve a second performance state at said physical load impedance and said physical time duration, wherein said second performance state is closer than said first performance state to an actual performance state arising during times in which said electronic devices are embodied and operable within an integrated circuit semiconductor substrate;

repeating the resizing and adjusting steps to obtain a final layout configuration;

generating a mask embodying said final layout configuration; and processing said final layout configuration upon a silicon substrate to produce an integrated circuit.

8. The integrated circuit simulation methodology as recited in claim 7, wherein said step of providing a plurality of electronic devices comprises choosing a specific cell representing circuit layout of each said electronic device from a cell library.

9. The integrated circuit simulation methodology as recited in claim 7, wherein said step of providing the load impedance and the time duration comprises obtaining stored load impedance and time duration values for each said respective cell.

10. The integrated circuit simulation methodology as recited in claim 7, wherein said physical load impedance and said physical time duration are a function of the specific location in which said plurality of electronic devices are modeled within said integrated circuit area.

11. The integrated circuit simulation methodology as recited in claim 7, wherein said resizing step comprises adjusting the specific locations in which said plurality of electronic devices are modeled within said integrated circuit area.

12. The integrated circuit simulation methodology as recited in claim 7, wherein said integrated circuit operates having an actual output signal substantially closer to said second computer simulated output than said first computer simulated output.

13. An integrated circuit layout methodology for manufacturing an integrated circuit, comprising the steps of:

selecting a model of a plurality of electronic devices from a library containing said devices, each said device having an input node and an output node and a load impedance at each said output node and a time duration between activation of each said input node and respective said output node;

applying said computer simulated input signal upon each said input node;

measuring a second simulated output signal upon each said output node;

sizing select said plurality of electronic devices to achieve a first performance state at said load impedance and said time duration;

configuring a model of said devices at specific locations within a integrated circuit area and connecting a model of routing between each said device to obtain a physical load impedance and a physical time duration;

reapplying said computer simulated input signal upon each said input node;

measuring a second output signal upon each said output node;

resizing select said plurality of electronic devices based on variability of said routing length in order to achieve a second performance state at said physical load impedance and said physical time duration, wherein said second performance state is closer than said first performance state to an actual performance state arising during times in which said electronic devices are embodied and operable Within an integrated circuit semiconductor substrate;

adjusting select said plurality of electronic devices within said integrated circuit area;

repeating the resizing and adjusting steps to obtain an actual layout configuration; and processing said final layout configuration upon a silicon substrate to produce an integrated circuit.

* * * * *

UNITED STATES PATENT AND TRADEMARK OFFICE
CERTIFICATE OF CORRECTION

PATENT NO. : 5,422,317
DATED : June 6, 1995
INVENTOR(S) : Hung K. Hua, et al.

It is certified that error appears in the above-indentified patent and that said Letters Patent is hereby corrected as shown below:

Claim 13, col. 12, line 13, please delete "said" and substitute therefor -- a--.

Claim 13, col. 12, line 15, please delete "second" and substitute therefor --first--.

Claim 13, col. 12, line 21, please delete "a" and substitute therefor --an-- .

Claim 13, col. 12, line 27, after "measuring a second" please add --simulated--.

Claim 13, col. 12, line 37, please delete "Within" and substitute therefor --within--.

Signed and Sealed this

Twelfth Day of September, 1995

BRUCE LEHMAN

Attest:

Attesting Officer

Commissioner of Patents and Trademarks